(12) United States Patent
Sheen et al.

(10) Patent No.: US 7,435,516 B2
(45) Date of Patent: Oct. 14, 2008

(54) PHOTOSENSITIVE MATERIAL FOR NON-SUBSTRATE LIQUID CRYSTAL DISPLAY

(75) Inventors: Yuung Ching Sheen, Hsinchu County (TW); Juh Shyong Lee, Hsinchu (TW); Wen Ping Chuang, Taipei County (TW); Yih Her Chang, Hsinchu County (TW); Su Mei Wei, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/907,852

(22) Filed: Oct. 18, 2007

(65) Prior Publication Data

US 2008/0044597 A1 Feb. 21, 2008

Related U.S. Application Data

(63) Continuation of application No. 11/374,955, filed on Mar. 15, 2006, now abandoned, which is a continuation-in-part of application No. 10/792,813, filed on Mar. 5, 2004, now abandoned.

(30) Foreign Application Priority Data

Nov. 18, 2003 (TW) .............................. 92132258 A

(51) Int. Cl.
*C09K 19/00* (2006.01)
*G03F 7/00* (2006.01)
(52) U.S. Cl. ...................................... 430/20; 430/270.1
(58) Field of Classification Search .............. 430/270.1, 430/20
See application file for complete search history.

(56) References Cited

U.S. PATENT DOCUMENTS

| 4,089,804 | A | 5/1978 | Falk |
| 4,688,900 | A | 8/1987 | Doane et al. |
| 5,096,282 | A | 3/1992 | Margerum et al. |
| 5,608,555 | A | 3/1997 | Onishi et al. |
| 6,815,016 | B2 | 11/2004 | Kyu et al. |
| 2005/0106377 | A1 | 5/2005 | Koestner et al. |
| 2005/0107522 | A1 | 5/2005 | Sheen et al. |
| 2006/0066803 | A1* | 3/2006 | Aylward et al. ............. 349/158 |

FOREIGN PATENT DOCUMENTS

WO WO 02/42832 A2 5/2002

* cited by examiner

*Primary Examiner*—Amanda C. Walke
(74) *Attorney, Agent, or Firm*—Bacon & Thomas PLLC

(57) ABSTRACT

The present invention provides a photosensitive material for non-substrate liquid crystal display. This photosensitive material includes photo-initiator selected from the free-radical type or cation type photo-initiator or mixture thereof, photosensitive polymerizable monomers or oligomers selected from the group consisting of double-bond compounds, compounds having epoxy functional group and mixtures thereof, and modifier selected from the group consisting of long-alkyl-chain functional group, silicone-alkyl compounds, double-bond compounds and mixtures thereof. The photosensitive material can surround liquid crystal display cell and separate from assisting substrates that a non-substrate liquid crystal cell surrounded by photosensitive material is acquired.

8 Claims, 3 Drawing Sheets

PHOTOSENSITIVE MATERIAL FOR NON-SUBSTRATE LIQUID CRYSTAL DISPLAY

CROSS REFERENCES TO THE RELATED APPLICATIONS

This application is a continuation application of pending U.S. application Ser. No. 11/374,955, filed Mar. 15, 2006, which is a continuation-in-part application of U.S. application Ser. No. 10/792,813, filed Mar. 5, 2004, now abandoned. The entire disclosures of the prior applications are hereby incorporated by reference.

BACKGROUND OF THE INVENTION

1. Field of the Invention

The present invention relates to a photosensitive material for fabricating a flexible substrate used for non-substrate liquid crystal display that can separate from assisting substrates.

2. Description of the Related Art

The application of flat panel display (FPD) has helped reduce the weight and volume of display. The currently available liquid crystal display (LCD) technologies employ passive scan or active matrix to display images, which however requires considerable thickness stability for precision control. Otherwise even slight deformation will lead to serious image distortion. To bring about thinner and more impact-resistant FPD, some of the FPD technologies for conventional glass substrate process have shifted focus to the R&D of plastic substrate. The development of flexible FPD has brought FPD to a new prospect in terms of thinness, impact-resistance and ease of carriage.

As for the substrate of flexible FPD, plastic materials have received the most attention for their characteristics of being lighter, thinner, more impact-resistant, mobile, and easy to carry. But in processes with temperature of 200° C. or higher, plastic material is prone to deformation or even decomposition, hence limiting its dimensions and applications. To bypass the shortcomings of plastic substrate, non-substrate FPD is expected to be the process that draws the focus attention.

The patent of Philips entitled Liquid Crystal Display Laminate and Method of Manufacturing Such filed with WIPO (WO02/42832 A2) and published in Nature in 2002 reveals a process for single substrate LCD. The process employs UV radiation to produce polymerization and at the same time form polymer-covered liquid crystal with PSCOF (phase separated composite organic film) structure, which maintains uniformity on curved screens.

In the efforts to develop lighter and thinner non-substrate flexible FPD with greater design flexibility, photosensitive material is one of the key materials and technologies for the new process. Through the design of molecular structure, adjustment of compositions, and application of modification technologies targeting different needs, photosensitive material can be made to possess good flexibility and physical properties and stay free of the drawbacks of plastic materials, including poor resistance to high temperature and infiltration of oxygen and moisture that would cause damage to the liquid crystal display cell.

SUMMARY OF THE INVENTION

The present invention discloses a photosensitive material for fabricating a flexible substrate used for non-substrate liquid crystal display which comprises photo-initiator selected from the group consisting of diethoxy acetophenone, benzophenone, benzyl benzoin isobutyl ether, benzyl dimethyl ketal, 1-hydroxycyclohexyl phenyl ketone, diethyl thioxanthone, 2-ethyl anthraquinone, 2-hydroxy-2-methyl-1-phenylpropane-1-one, 1-(4-isopropylphenyl)-2-hydroxy-2-methylpropane-1-one), (2-methyl-[4-(methylthio)phenyl]2-morpholino-1-propane), aromatic diazonium salts, triallysulfonium salts, diallyiodonium salts, triallylselenium salts of Lewis acid as well as metallocene compounds and mixtures thereof; photosensitive polymerizable monomers or oligomers selected from the groups consisting of double-bond compounds, compounds having epoxy functional group and mixtures thereof; and modifier selected from the groups consisting of long-alkyl-chain functional group, silicone-alkyl compounds, double-bond compounds and mixtures thereof. The photosensitive material after polymerization and curing can form a flexible substrate liquid crystal display cell.

The aforesaid photo-initiator comprises 2,2-diethoxyacetophenone or benzophenone.

The aforesaid photosensitive polymerizable monomer or oligomer comprises PU type acrylate, acrylic monomer, epoxy compound, urethane acrylates, acrylic acrylates, epoxy acrylates, polyester acrylates.

The aforesaid modifier comprises siloxane, fluorinated ether or alcohol.

The aforesaid modifier increases the flexibility and releasability of the photosensitive material.

The mixing ratio of the aforesaid photo-initiator, photosensitive polymerizable monomer or oligomer, and modifier in the photosensitive material is 0.1-15 wt % photo-initiator, 10-99 wt % photosensitive polymerizable monomer or oligomer, and 0.1-5 wt % modifier, and the ratio of photo-initiator: photosensitive polymerizable monomer or oligomer: modifier by weight is preferably 2:96:2.

The aforesaid photosensitive material may polymerize and cure under the irradiation of 350-380 nm ultraviolet light or high-pressure mercury lamp.

The aforesaid photosensitive material may be further mixed with liquid crystal material or other nanometer particles.

Another objective of the present invention is to provide a photosensitive material for fabricating a flexible substrate used for non-substrate liquid crystal display, which comprises:

0.1-15 wt % photo-initiator selected from the group consisting of diethoxy acetophenone, benzophenone, benzyl benzoin isobutyl ether, benzyl dimethyl ketal, 1-hydroxycyclohexyl phenyl ketone, diethyl thioxanthone, 2-ethyl anthraquinone, 2-hydroxy-2-methyl-1-phenylpropane-1-one, 1-(4-isopropylphenyl)-2-hydroxy-2-methylpropane-1-one), (2-methyl-[4-(methylthio)phenyl]2-morpholino-1-propane), aromatic diazonium salts, triallysulfonium salts, diallyiodonium salts, triallylselenium salts of Lewis acid as well as metallocene compounds and mixtures thereof;

10-99 wt % photosensitive polymerizable monomers or oligomers selected from the group consisting of double-bond compounds, compounds having epoxy functional group and mixtures thereof; and 0.1-5 wt % modifier selected from the group consisting of long-alkyl-chain functional group, silicone-alkyl compounds, double-bond compounds and mixtures thereof; said photosensitive material after curing can form a flexible substrate liquid crystal display cell.

The photosensitive material disclosed in this invention may be used in the process for non-substrate liquid crystal display to fabricate a display without the support of rigid substrate. The photosensitive material after being cured exhibits flexibility and releasability superior to those of regular photosensitive polymerization-cured resins. Such photosensitive material is a key material in the manufacturing of rigid substrate-free flexible liquid crystal display.

DETAILED DESCRIPTION OF THE INVENTION

Figure 1:
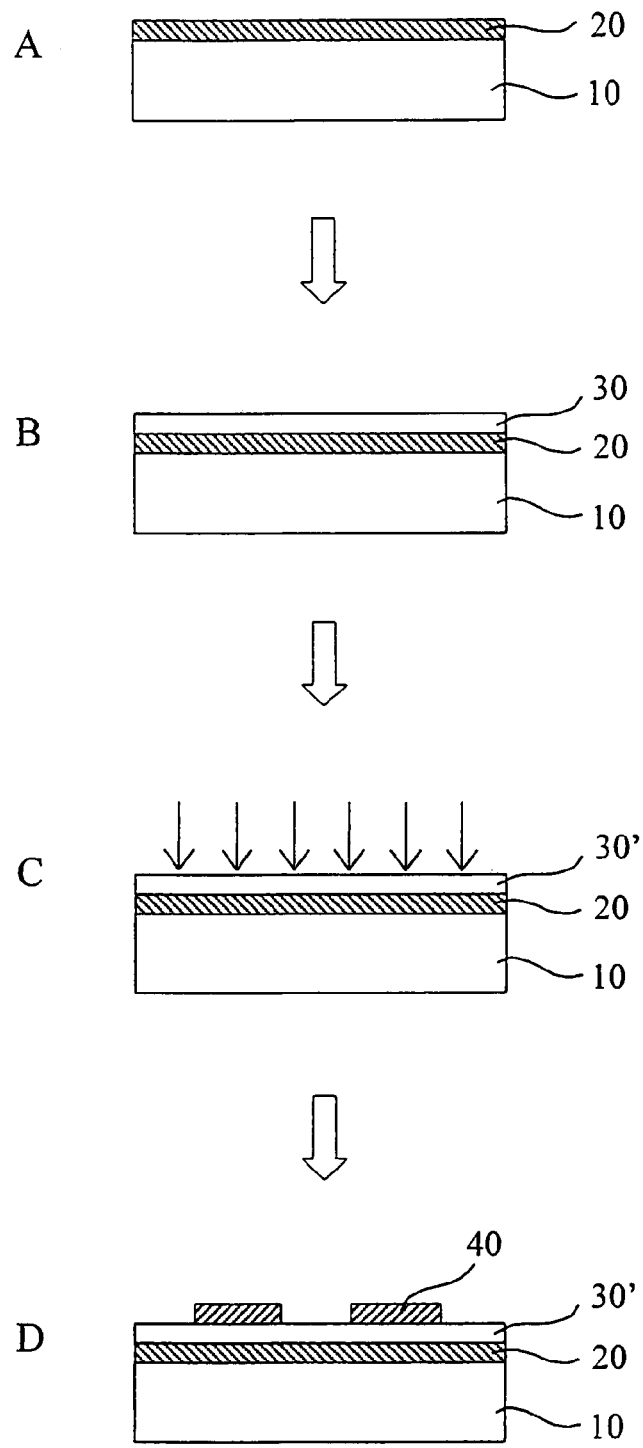
FIG. 1 illustrates the flow chart for the fabrication of first assisting substrate.

The present invention discloses a photosensitive material for fabricating a flexible substrate used for non-substrate liquid crystal display comprising photo-initiator selected from the group consisting of diethoxy acetophenone, benzophenone, benzyl benzoin isobutyl ether, benzyl dimethyl ketal, 1-hydroxycyclohexyl phenyl ketone, diethyl thioxanthone, 2-ethyl anthraquinone, 2-hydroxy-2-methyl-1-phenylpropane-1-one, 1-(4-isopropylphenyl)-2-hydroxy-2-methylpropane-1-one), (2-methyl-[4-(methylthio)phenyl]2-morpholino-1-propane), aromatic diazonium salts, triallysulfonium salts, diallyiodonium salts, triallylselenium salts of Lewis acid as well as metallocene compounds and mixtures thereof, preferably 2,2-diethoxyacetophenone or benzophenone; photosensitive polymerizable monomers or oligomers selected from the group consisting of double-bond compounds, compounds having epoxy functional group and mixtures thereof, preferably polyurethane type acrylate; and modifier selected from the group consisting of long-alkyl-chain functional group, silicone-alkyl compounds, double-bond compounds and mixtures thereof, preferably siloxane, fluorinated ether, or alcohol. Said photosensitive material can be cured to form a flexible substrate for liquid crystal display.

The mixing ratio of the aforesaid photo-initiator, photosensitive polymerizable monomer or oligomer, and modifier in the photosensitive material by weight is 2:96:2. The aforesaid modifier can enhance the flexibility and releasability of photosensitive material.

The aforesaid photosensitive material may polymerize and cure under the irradiation of 350-380 nm ultraviolet light or high-pressure mercury lamp, preferably by 365 nm ultraviolet light.

The advantages of the present invention are further depicted with the illustration of examples, but the descriptions made in the examples should not be construed as a limitation on the actual application of the present invention.

EXAMPLE 1

Preparation of Photosensitive Material (I)

After mixing modifier Zonyl FSO (DuPont) at 0.1 wt % of photosensitive material and photosensitive material Norland Optical Adhesive 65 (NOA-65, Norland), apply the mixture to 50 μm PET film with 4# wire rod (9 μm) or dip coat the mixture on glass. Subject the mixture to irradiation of 365 nm ultraviolet light for 5 seconds, then measure its contact angle. The results are presented in Table 1.

EXAMPLE 2

Preparation of Photosensitive Material (II)

After mixing modifier BYK333 at 1.5 wt % of photosensitive material and photosensitive material NOA-65, apply the mixture to 50 μm PET film with 4# wire rod (9 μm) or dip coat the mixture on glass. Subject the mixture to irradiation of 365 nm ultraviolet light for 5 seconds, then measure its contact angle. The results are presented in Table 1.

EXAMPLE 3

Preparation of Photosensitive Material (III)

After mixing modifier BYK333 (BYK Chemie USA Inc.) at 1.0 wt % of photosensitive material, Surfynol OP340 (Air Products and Chemicals, INC) at 0.5 wt % of photosensitive material, and photosensitive material NOA-65, apply the mixture to 50 μm PET film with 4# wire rod (9 μm) or dip coat the mixture on glass. Subject the mixture to irradiation of 365 nm ultraviolet light for 5 seconds, then measure its contact angle. The results are presented in Table 1.

EXAMPLE 4

Preparation of Photosensitive Material (IV)

After mixing modifier BYK333 at 2.0 wt % of photosensitive material and photosensitive material NOA-65, apply the mixture to 50 μm PET film with 4# wire rod (9 μm) or dip coat the mixture on glass. Subject the photosensitive material to irradiation of 365 nm ultraviolet light for 5 seconds, then measure its contact angle. The results are presented in Table 1.

EXAMPLE 5

Preparation of Photosensitive Material (V)

After mixing modifier BYK333 at 1.5 wt % of photosensitive material, Surfynol OP340 (Air Products and Chemicals, INC) at 0.5 wt % of photosensitive material, and photosensitive material NOA-65, apply the mixture to 50 μm PET film with 4# wire rod (9 μm) or dip coat the mixture on glass. Subject the photosensitive material to irradiation of 365 nm ultraviolet light for 5 seconds, then measure its contact angle. The results are presented in Table 1.

TABLE 1

Measurements of Contact Angles from Examples 1~5

| Example | Contact Angle | |
| --- | --- | --- |
| | PET film coated with release film | PET film |
| 1 | 59.47 | 39.56 |
| 2 | 44.65 | 36.9 |
| 3 | 45.68 | 37.7 |
| 4 | 33.35 | 41.69 |
| 5 | 31.5 | 38.72 |

As shown in Table 1, with the mixture of photosensitive material and modifier applied on PET film with or without the coating of release film, the contact angles measured in Examples 1~3 are greater on PET films coated with release film than those on PET films without release film, while it is the opposite in Examples 4 & 5. Smaller contact angle value means the proximity of the surface tension of the two matters. Thus the modifiers in Examples 4 & 5 exhibit better effect, while that in Example 5 shows the best result.

EXAMPLE 6

Non-Substrate Liquid Crystal Display Cell Process

The manufacturing of first assisting substrate 10 is carried out first. As shown in FIG. 1, apply a layer of release agent 20 on first assisting substrate 10. Next, apply photosensitive material 30 prepared in Example 5 on release agent layer 20 as shown in FIG. 1B; as shown in FIG. 1C, irradiate 365 nm UV light on photosensitive material 30 for 5 seconds to form a cured photosensitive material layer 30'; as shown in FIG. 1D, fabricate electrode pattern 40 on cured photosensitive material layer 30.

Figure 2:
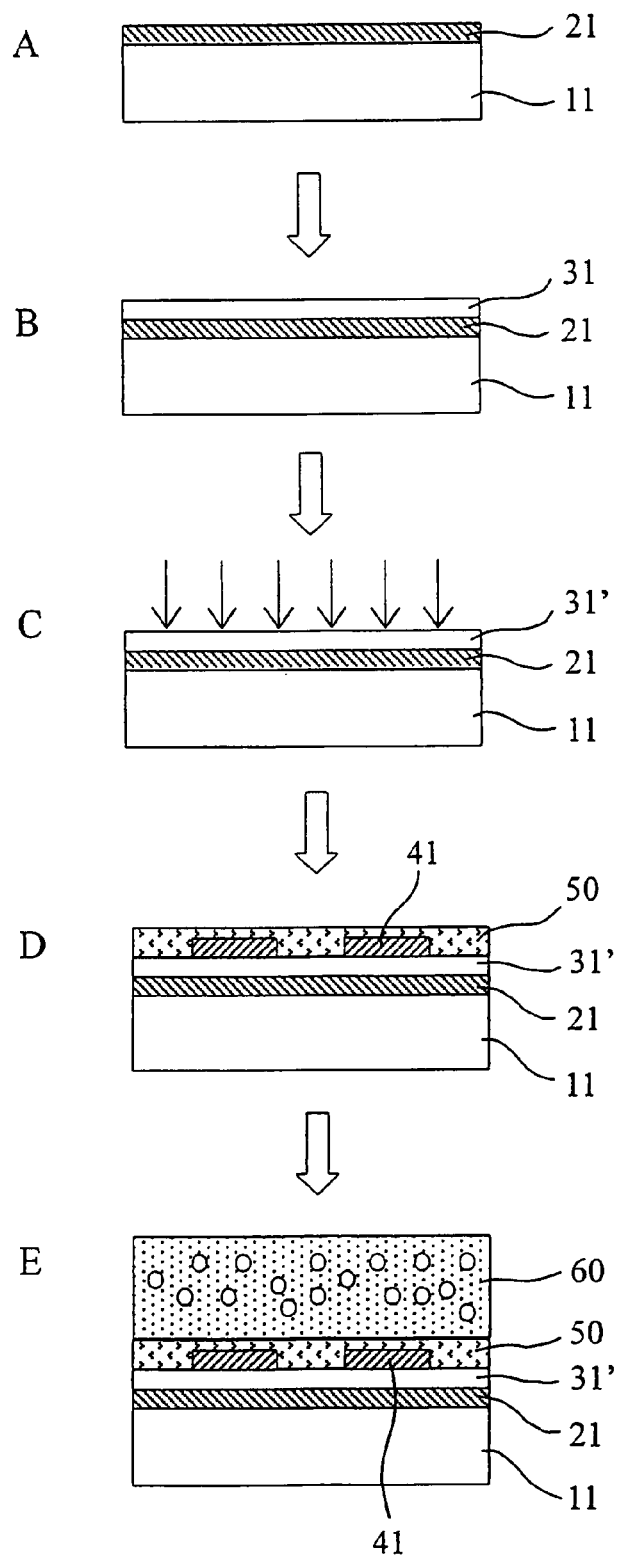
FIG. 2 illustrates the flow chart for the fabrication of second assisting substrate.

Next carry out the manufacturing of second assisting substrate 11. As shown in FIG. 2A to 2C, the steps in the process are the same as those in the manufacturing of first assisting substrate: first apply release agent layer 21 on second assisting substrate 11 as shown in FIG. 2A. Next apply photosensitive material 31 on release agent layer 21 as shown in FIG. 2B, then polymerize and cure the photosensitive material with UV light to form cured photosensitive material layer 31' as shown in FIG. 2C. Then fabricate electrode pattern 41 on cured photosensitive material layer 31' as shown in FIG. 2D and coat alignment layer 50. Subsequently apply photo-polymerizable mixture 60, which contains photosensitive material and liquid crystal material on alignment layer 50 as shown in FIG. 2E.

Figure 3:
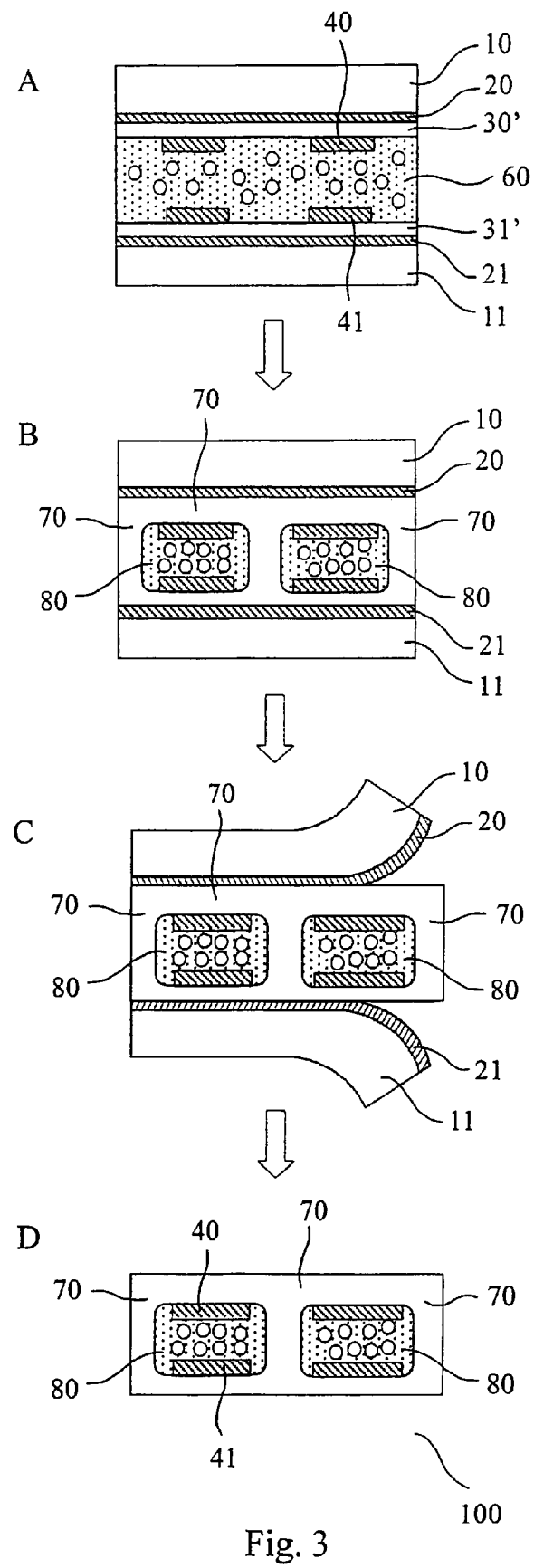
FIG. 3 illustrates the flow chart for the fabrication of non-substrate liquid crystal display cell.

FIG. 3 depicts the process of assembling first assisting substrate 10 and second assisting substrate 11. As shown in FIG. 3A, place first assisting substrate 10 upside down over second assisting substrate 11 and align as shown in FIG. 3A, and then expose the two substrates to UV light through photomask (not shown in the figure); after exposure, the photo-polymerizable mixture 60 forms a plurality of polymer walls 70 which adjoin the first assisting substrate 10 and the second assisting substrate 11, and induce the phase-separation between liquid crystal and photosensitive material with polymer walls 70 surrounding the liquid crystal 80; next, peel off first assisting substrate 10, second assisting substrate 11, and their respective release agent layer 20 and 21 as shown in FIG. 3C; finally, a flexible substrate liquid crystal display cell 100, i.e. non-rigid-substrate liquid crystal display cell, is obtained as shown in FIG. 3D.

What is claimed is:

1. A flexible non-substrate liquid crystal display cell, comprising:
   a plurality of polymer walls;
   liquid crystal; and
   at least one electrode pattern;
   wherein said polymer walls surround said liquid crystal to form liquid display cells without any assisting substrate and said at least one electrode pattern is located between said polymer walls and said liquid crystal.

2. The flexible non-substrate liquid crystal display cell according to claim 1, wherein said polymer walls are manufactured by exposing a photo-polymerizable mixture to UV light.

3. The flexible non-substrate liquid crystal display cell according to claim 2, wherein said photo-polymerizable mixture contains photosensitive material and liquid crystal material.

4. The flexible non-substrate liquid crystal display cell according to claim 3, wherein said photosensitive material has a composition comprising:
   0.1-15 wt % photo-initiator selected from the group consisting of diethoxy acetophenone, benzophenone, benzyl benzoin isobutyl ether, benzyl dimethyl ketal, 1-hydroxycyclohexyl phenyl ketone, diethyl thioxanthone, 2-ethyl anthraquinone, 2-hydroxy-2-methyl-1-phenyl-propane-1-one, 1-(4-isopropylphenyl)-2-hydroxy-2-methylpropane-1-one), (2-methyl-[4-(methylthio)phenyl]2-morphoholino-1-propane), aromatic diazonium salts, triallysulfonium salts, diallyiodonium. salts, triallylselenium salts of Lewis acid as well as metallocene compounds and mixtures thereof;
   10-99 wt % photosensitive polymerizable monomers or oligomers selected from the group consisting of double-bond compounds, compounds having cycloxyepoxy functional group and mixtures thereof; and
   $\leq$5 wt % modifier selected from the group consisting of long-alkyl-chain functional group, silicone-alkyl compounds, double-bond compounds and mixtures thereof.

5. The flexible non-substrate liquid crystal display cell according to claim 4, wherein said photo-initiator comprises 2,2-diethoxyacetophenone or benzophenone.

6. The flexible non-substrate liquid crystal display cell according to claim 4, wherein said photosensitive polymerizable monomer comprises polyurethane type acrylates, acrylic monomer, epoxy compound, urethane acrylates, acrylic acrylates, epoxy acrylates or polyester acrylates.

7. The flexible non-substrate liquid crystal display cell according to claim 4, wherein the mixing ratio of photo-initiator, photosensitive polymerizable monomers or oligomers, and modifier by weight is 2:96:2.

8. The flexible non-substrate liquid crystal display cell according to claim 2, wherein said UV light has wavelength of 350-380 nm.

* * * * *